(12) United States Patent
Minelli

(10) Patent No.: US 9,960,301 B2
(45) Date of Patent: May 1, 2018

(54) METHOD OF MANUFACTURING FLEXIBLE, LIGHTWEIGHT PHOTOVOLTAIC ARRAY

(71) Applicant: ORBITAL SCIENCES CORPORATION, Dulles, VA (US)

(72) Inventor: Robert Minelli, Burke, VA (US)

(73) Assignee: Orbital Sciences Corporation, Dulles, VA (US)

( * ) Notice: Subject to any disclaimer, the term of this patent is extended or adjusted under 35 U.S.C. 154(b) by 0 days. days.

(21) Appl. No.: 15/076,081

(22) Filed: Mar. 21, 2016

(65) Prior Publication Data

US 2017/0054046 A1 Feb. 23, 2017

Related U.S. Application Data

(63) Continuation of application No. 12/540,685, filed on Aug. 13, 2009, now abandoned, which is a continuation-in-part of application No. 12/471,094, filed on May 22, 2009, now abandoned.

(60) Provisional application No. 61/128,510, filed on May 22, 2008, provisional application No. 61/130,148, filed on May 27, 2008.

(51) Int. Cl.
| | |
|---|---|
| *H01L 31/18* | (2006.01) |
| *H05K 3/30* | (2006.01) |
| *H05K 1/18* | (2006.01) |
| *H05K 3/28* | (2006.01) |
| *H01L 31/05* | (2014.01) |
| *H01L 31/048* | (2014.01) |
| *H01L 31/02* | (2006.01) |
| *H05K 3/00* | (2006.01) |

(52) U.S. Cl.
CPC .... *H01L 31/0504* (2013.01); *H01L 31/02008* (2013.01); *H01L 31/048* (2013.01); *H01L 31/188* (2013.01); *H05K 1/189* (2013.01); *H05K 3/281* (2013.01); *H05K 3/305* (2013.01); *H05K 3/0058* (2013.01); *H05K 2201/015* (2013.01); *H05K 2201/0154* (2013.01); *H05K 2201/10121* (2013.01); *Y02E 10/50* (2013.01); *Y02P 70/613* (2015.11)

(58) Field of Classification Search
CPC .......... H01L 31/0504; H01L 31/02008; H01L 31/048; H01L 31/188; H05K 1/189; H05K 3/281; H05K 3/305; H05K 3/0058
See application file for complete search history.

(56) References Cited

U.S. PATENT DOCUMENTS

| | | |
|---|---|---|
| 6,130,465 A | 10/2000 | Cole |
| 6,224,016 B1 | 5/2001 | Lee et al. |
| 6,410,362 B1 | 6/2002 | Simburger et al. |
| 7,709,729 B2 | 5/2010 | Simburger et al. |

(Continued)

*Primary Examiner* — Matthew T Martin
(74) *Attorney, Agent, or Firm* — Christensen, Fonder, Dardi & Herbert, PLLC

(57) ABSTRACT

A flexible, lightweight photovoltaic cell array includes one or more individual photovoltaic cell strings attached to a polyimide film substrate and covered with a polyvinyl fluoride film. Each photovoltaic cell string includes one or more photovoltaic cells attached to a flexible printed circuit board. The photovoltaic cell array may be manufactured by a method that includes bonding at least one photovoltaic cell to a flexible printed circuit board, mounting the flexible printed circuit board on a polyimide film substrate, and covering the flexible printed circuit board with a substantially transparent polyvinyl fluoride film.

18 Claims, 4 Drawing Sheets

(56) References Cited

U.S. PATENT DOCUMENTS

2004/0187906 A1 9/2004 Boulanger et al.
2005/0178426 A1 8/2005 Simburger et al.

METHOD OF MANUFACTURING FLEXIBLE, LIGHTWEIGHT PHOTOVOLTAIC ARRAY

CROSS REFERENCE TO RELATED APPLICATIONS

This is a continuation of U.S. patent application Ser. No. 12/540,685, filed Aug. 13, 2009, which is a continuation-in-part of U.S. patent application Ser. No. 12/471,094, filed May 22, 2009, which claims the benefit of U.S. Provisional Application No. 61/128,510 filed May 22, 2008, and U.S. Provisional Application No. 61/130,148 filed May 27, 2008, all of which are incorporated herein by reference in their entireties.

BACKGROUND OF THE INVENTION

The invention relates to photovoltaic arrays. More particularly, the invention relates to flexible, lightweight photovoltaic arrays suitable for mounting directly on a surface of, or being deployed from, a spacecraft or an airplane.

Photovoltaic cell strings include individual photovoltaic cells connected in series so as to obtain a desired voltage, according to characteristics of the photovoltaic cells. The photovoltaic cell strings are then connected in parallel so as to obtain a desired output capacity or current, thus creating a photovoltaic cell array.

Traditionally, photovoltaic arrays have been fabricated on a graphite panel. Typically, this panel is the thickest member of an array of photovoltaic cells and contributes most of the weight to the array. In spacecraft or certain consumer applications, it is desirable to minimize the weight of the photovoltaic array.

Additionally, traditional photovoltaic array manufacturing methods involve extensive manual labor, which gives rise to relatively high manufacturing costs.

SUMMARY OF THE INVENTION

The invention relates to a method of manufacturing a low-cost, flexible, lightweight photovoltaic array.

According to one aspect, the invention relates to a photovoltaic array that includes at least one photovoltaic cell bonded to a flexible printed circuit board. The flexible printed circuit board is mounted on a substrate of a polyimide film, such as that sold by E.I. du Pont de Nemours and Company under the trademark KAPTON®, reinforced with aramid fiber such as that sold by E.I. du Pont de Nemours and Company under the trademark KEVLAR®. The flexible printed circuit board may then be covered by a substantially transparent abrasion-resistant film (e.g., a polyvinyl fluoride film, such as that sold by E.I. du Pont de Nemours and Company under the trademark TEDLAR®). In one embodiment, the photovoltaic array is suitable for mounting directly on a surface of, or being deployed from, a spacecraft or an airplane.

In one embodiment, a bladder sleeve is attached to the polyimide film substrate to facilitate inflatable deployment. The bladder sleeve preferably is applied prior to covering the polyimide film substrate with the abrasion-resistant transparent film. Additionally, the bladder sleeve may also be used for mechanical boom deployment.

In one embodiment, a substantial reduction in manufacturing costs is achieved by bonding the one or more photovoltaic cells to the printed circuit board using automated assembly equipment such as for example, surface-mount technology placement systems (e.g., pick-and-place machines).

In one embodiment, one side of the polyimide film substrate, to which the photovoltaic cells are to be applied is coated with an adhesive, while the other side of the polyimide film substrate is coated with a high-emissivity coating (e.g., high-emissivity paint) to facilitate dissipation of waste heat. The adhesive preferably is a silicone-based adhesive, such as CV10-2568, available from NuSil Technology, of Carpinteria, Calif.

BRIEF DESCRIPTION OF THE DRAWINGS

The above and other features of the present invention, its nature and various advantages will be more apparent upon consideration of the following detailed description, taken in conjunction with the accompanying drawings, in which like reference characters represent like parts throughout and in which.

DETAILED DESCRIPTION

To provide an overall understanding of the invention, certain illustrative embodiments will now be described, including a flexible lightweight photovoltaic array and a method for manufacturing the photovoltaic array. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1:
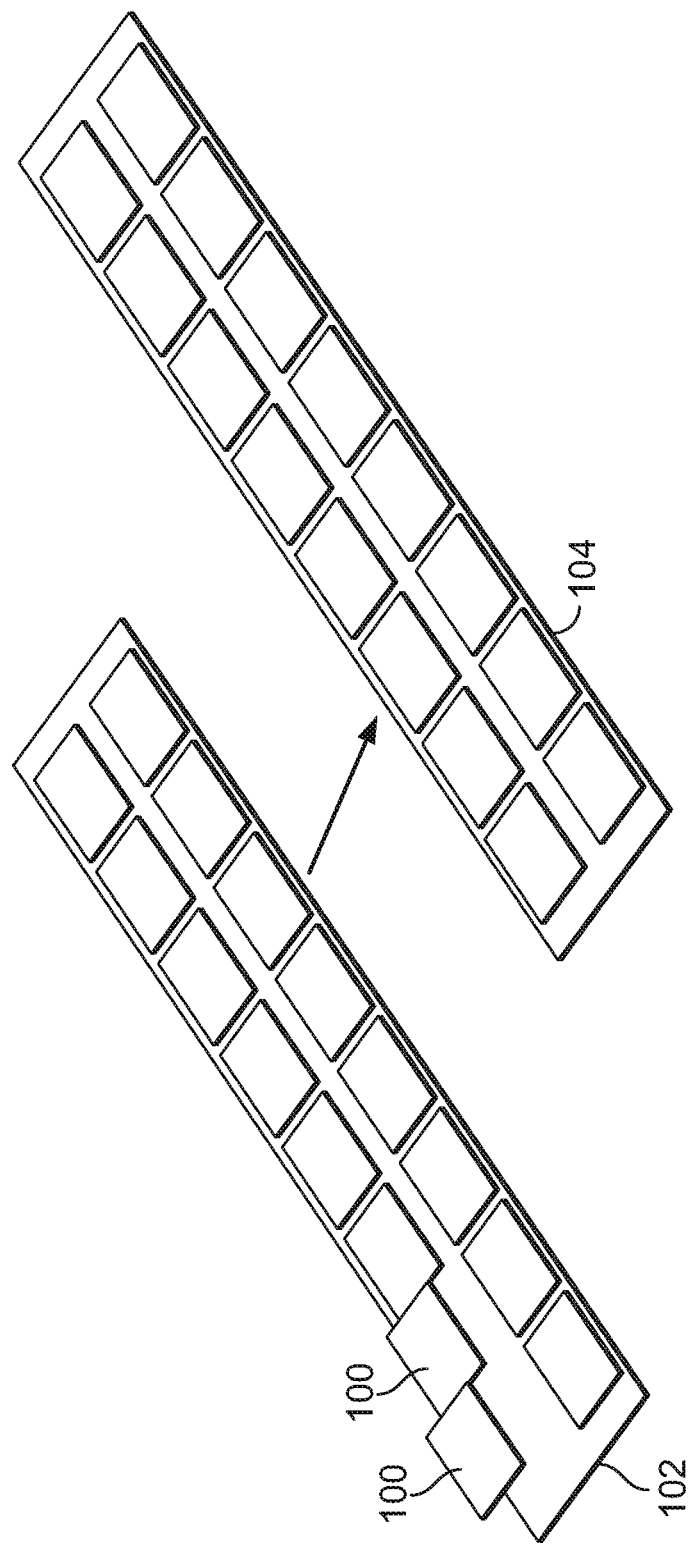
FIG. 1 is a diagram illustrating the process of assembling a string carrier, according to an illustrative embodiment of the invention.

Individual photovoltaic cells are connected in series so as to obtain a desired voltage, according to characteristics of the photovoltaic cells, to create photovoltaic cell strings. The photovoltaic cell strings are then connected in parallel so as to obtain a desired output capacity, thus creating a photovoltaic cell array. FIG. 1 shows the assembly of individual photovoltaic cell strings 104 in accordance with an illustrative embodiment of the present invention. As shown in FIG. 1, one or more photovoltaic cells 100 are bonded onto a printed circuit board (PCB) 102 to create a photovoltaic cell string 104. PCB 102 is preferably a flexible PCB, but alternatively may be a rigid PCB. Photovoltaic cells 100 preferably are bonded to PCB 102 using automated assembly equipment such as, for example, surface-mount technology placement systems. In one embodiment, photovoltaic cells 100 may be soldered to PCB 102 using pick-and-place machines.

Photovoltaic cells 100 may soldered to PCB 102 using, for example, wave soldering. A solder mask is applied to areas of the photovoltaic cells 100 and the PCB 102 on which solder is not desired. Photovoltaic cells 100 are then glued to PCB 102 using pick-and-place machines, and PCB 102 is then run through a wave of molten solder. The solder wets metal surfaces not coated with the solder mask to form electrical connections between the photovoltaic cells 100 and the PCB 102. The use of automated assembly equipment reduces labor costs and improves the rate at which photovoltaic cell strings are assembled.

The photovoltaic cells 100, within a photovoltaic cell string 104 are wired in series to generate a fixed voltage for each photovoltaic cell string 104. The number of photovoltaic cells 100 in a particular photovoltaic cell string 104 is determined by the voltage requirement of the specific application. Preferably, the return trace is routed on the mounting surface of the PCB 102. In at least one embodiment, PCB 102 is a multi-layer PCB, and the return trace is routed underneath the photovoltaic cell string to reduce the magnetic moment and the associated loop area. A multi-layer PCB also allows for proper separation, thus reducing breakdown potential between layers which would result in string loss.

In at least one embodiment, string blocking diodes (not shown) are also installed onto PCB 102 using automated assembly equipment. Blocking diodes are used to prevent current from flowing back into one or more photovoltaic cell strings 104 which are not exposed to sunlight (e.g., in shaded areas or at nighttime). Additionally, blocking diodes may be installed between photovoltaic array 200 and the battery (not shown). Once a photovoltaic cell string 104 is assembled, individual photovoltaic cell strings 104 are wired together in parallel to generate the necessary capacity, thus creating a photovoltaic array 200.

Figure 2:
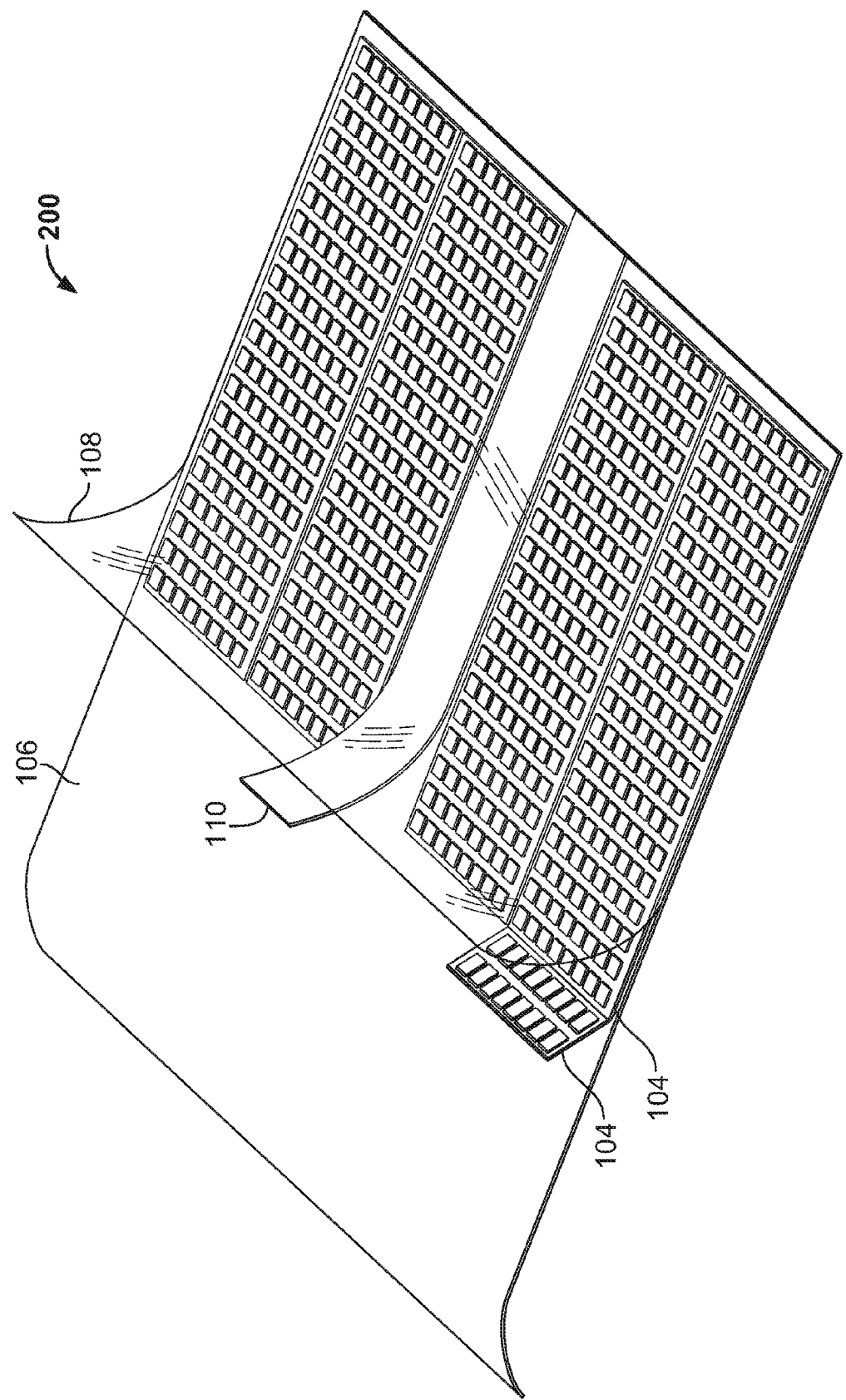
FIG. 2 is a diagram illustrating the process of assembling a flexible lightweight photovoltaic array, according to an illustrative embodiment of the invention.

FIG. 2 shows the assembly of a photovoltaic array 200 in accordance with an illustrative embodiment of the present invention. As shown in FIG. 2, one or more individual photovoltaic cell strings 104 are mounted onto a polyimide film substrate 106. The polyimide film substrate 106 preferably is reinforced with aramid fiber. In addition to photovoltaic cell strings 104, a bladder sleeve 110 may also be mounted onto polyimide film substrate 106 to facilitate inflatable deployment in spacecraft or other applications. Photovoltaic cell strings 104 and bladder sleeve 110 are mounted onto polyimide film substrate 106 using, for example, a silicone-based adhesive. In at least one embodiment, the adhesive is applied to the front face of polyimide film substrate 106 where photovoltaic cell strings 104 and bladder sleeve 110 are mounted. The back side of polyimide film substrate may be coated with a high-emissivity coating (e.g., high-emissivity paint) to facilitate dissipation of waste heat. In at least one embodiment, one or more wire harnesses (not shown) are also mounted on the front face of polyimide film substrate 106.

Once the appropriate number of photovoltaic cell strings 104 are mounted to polyimide film substrate 106, the entire assembly including photovoltaic cell strings 104, film substrate 106 and bladder sleeve 110, may be covered with a substantially transparent film 108. Film 108 may be, for example, a polyvinyl fluoride film to provide abrasion resistance for photovoltaic cells 102 (FIG. 1).

Figure 3:
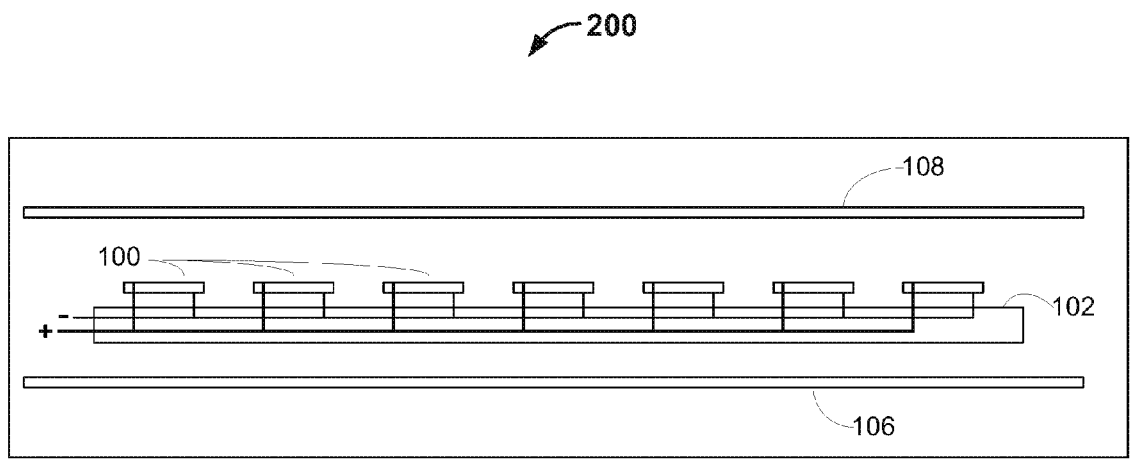
FIG. 3 is a schematic diagram of the flexible lightweight photovoltaic array manufactured according to the process of FIG. 2.

FIG. 3 is a schematic diagram of photovoltaic array 200 in accordance with an illustrative embodiment of the present invention. Photovoltaic array 200 includes photovoltaic cells 100 bonded onto PCB 102. PCB 102 is mounted onto film substrate 106, and photovoltaic cells 100 are then covered with film 108. Photovoltaic array 200 is suitable for mounting directly on a surface of, or being deployed from, a spacecraft or an airplane.

Figure 4:
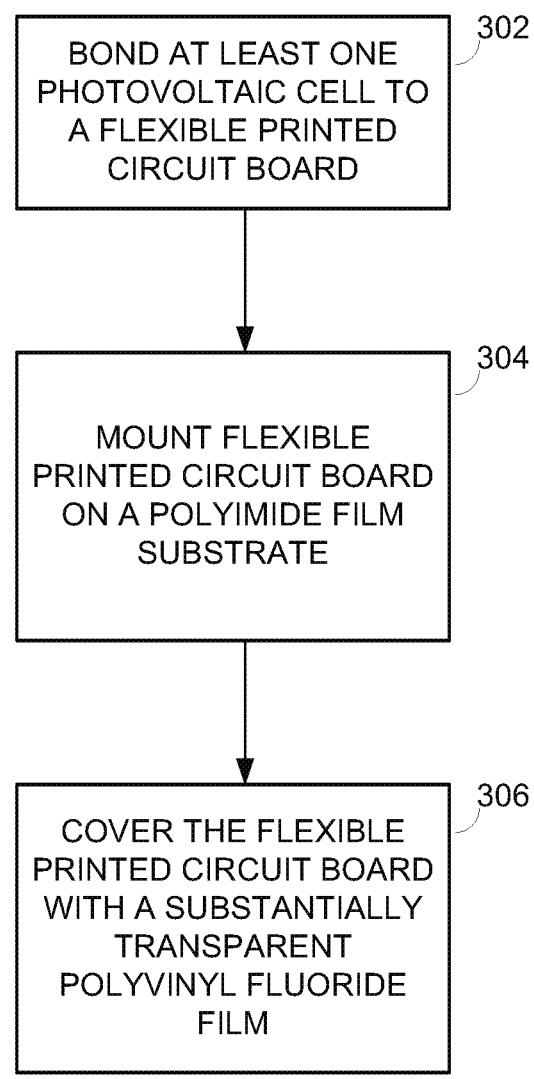
FIG. 4 is a flow chart of a method of manufacturing the flexible lightweight photovoltaic array of FIG. 3, according to an illustrative embodiment of the invention.

FIG. 4 is a flow chart of a method 300 of manufacturing the flexible lightweight photovoltaic array 200 of FIG. 3, in accordance with an illustrative embodiment of the present invention. In step 302, one or more photovoltaic cells are bonded to a flexible printed circuit board (PCB) using, for example, automated assembly equipment. The photovoltaic cells may be soldered onto the flexible PCB using a pick-and-place machine. In some embodiments, in addition to photovoltaic cells, blocking diodes also may be soldered onto the PCB using a pick-and-place machine.

Photovoltaic cells (and blocking diodes) are soldered to the PCB using, for example, wave soldering. A solder mask is applied to areas of the photovoltaic cells 100 and the PCB 102 on which solder is not desired. Photovoltaic cells 100 (and blocking diodes) are then glued to PCB 102 using pick-and-place machines, and PCB 102 is then run through a wave of molten solder. The solder wets metal surfaces not coated with the solder mask to form electrical connections between the photovoltaic cells 100 and the PCB 102.

The flexible PCB including photovoltaic cells (and blocking diodes) may then be mounted on a polyimide film substrate (step 304). The polyimide film substrate may be, for example, a 1 mil sheet of polyimide film reinforced with aramid fibers.

The flexible PCB preferably is attached to the polyimide film substrate preferably using a silicone-based adhesive. In at least one embodiment, one or more wire harnesses and/or one or more inflatable bladder sleeves are also mounted on the polyimide film substrate using a silicone-based adhesive. The adhesive is applied to the front face of the polyimide film substrate, on which the flexible PCB, one or more wire harnesses, and/or one or more bladder sleeves are mounted. The back side of the polyimide film substrate may be coated with a high-emissivity coating (e.g., high-emissivity paint) to facilitate dissipation of waste heat. In step 306, the entire assembly including photovoltaic cells bonded to the flexible PCB, which is attached to the film substrate is encapsulated by a substantially transparent film. The substantially transparent film may be, for example, a polyvinyl fluoride film. The assembled photovoltaic array is suitable for mounting directly on a surface of, or being deployed from, a spacecraft or an airplane.

The invention may be embodied in other specific forms without departing from the spirit or essential characteristics thereof. The foregoing embodiments are therefore to be considered in all respects illustrative, rather than limiting of the invention. The present invention is limited only by the claims which follow.

The invention claimed is:

1. A method of manufacturing a flexible photovoltaic array, the method comprising:
    obtaining a plurality of photovoltaic cells and a flexible printed circuit;
    applying a solder mask to areas of the photovoltaic cells and the flexible printed circuit on which solder is not desired;
    bonding the photovoltaic cells to the flexible printed circuit using a pick-and-place machine so that each photovoltaic cell is glued to the flexible printed circuit;
    running the flexible printed circuit and the photovoltaic cells through a wave of molten solder so that the solder wets metal surfaces not covered by the solder mask to form electrical connections between the photovoltaic cells and the flexible printed circuit;
    coating a first side of a polyimide film substrate with an adhesive;

mounting the flexible printed circuit to the first side of a polyimide film substrate with the adhesive; and covering the flexible printed circuit with a substantially transparent film.

2. The method of claim 1, further comprising:

coating a second side of the polyimide film substrate with a high-emissivity coating.

3. The method of claim 2, wherein coating the second side of the polyimide film substrate with the high-emissivity coating comprises coating the second side of the polyimide film substrate with high-emissivity paint.

4. The method of claim 1, further comprising:

attaching a bladder sleeve to the first side of the polyimide film substrate; and covering the flexible printed circuit and the bladder sleeve with the substantially transparent film.

5. The method of claim 4, wherein attaching the bladder sleeve to the first side of the polyimide film substrate occurs prior to covering the flexible printed circuit and the bladder sleeve with the substantially transparent film.

6. The method of claim 1, wherein the polyimide film substrate is reinforced with aramid fibers.

7. The method of claim 1, wherein covering the flexible printed circuit comprises covering the flexible printed circuit with a substantially transparent polyvinyl fluoride film.

8. The method of claim 1, further comprising mounting the film substrate directly to a surface of a spacecraft or an airplane.

9. A method of manufacturing a flexible photovoltaic array, the method comprising:

applying a solder mask to areas of a flexible printed circuit and at least one photovoltaic cell on which solder is not desired;

bonding the at least one photovoltaic cell to the flexible printed circuit using a pick-and-place machine so that the at least one photovoltaic cell is glued to the flexible printed circuit;

running the flexible printed circuit with the at least one bonded photovoltaic cell through a wave of molten solder so that the solder wets metal surfaces not covered by the solder mask to form electrical connections between the at least one photovoltaic cell and the flexible printed circuit;

mounting the flexible printed circuit on a first side of a polyimide film substrate; and covering the flexible printed circuit with a substantially transparent film.

10. The method of claim 9, further comprising:

coating the first side of the polyimide film substrate with an adhesive; and coating a second side of the polyimide film substrate with a high-emissivity coating.

11. The method of claim 10, wherein coating the second side of the polyimide film substrate with the high-emissivity coating comprises coating the second side of the polyimide film substrate with high-emissivity paint.

12. The method of claim 9, further comprising:

attaching a bladder sleeve to the first side of the polyimide film substrate; and covering the flexible printed circuit and the bladder sleeve with the substantially transparent film.

13. The method of claim 12, wherein attaching the bladder sleeve to the first side of the polyimide film substrate occurs before covering the flexible printed circuit and the bladder sleeve with the substantially transparent film.

14. The method of claim 12, further comprising connecting a number of photovoltaic cells in series so as to obtain a desired voltage and create a photovoltaic cell spring.

15. The method of claim 14, wherein attaching the bladder sleeve to the first side of the polyimide film substrate comprises attaching the bladder sleeve to the first side of the polyimide film substrate between a pair of photovoltaic cell springs.

16. The method of claim 15, further comprising connecting a plurality of photovoltaic cell springs in parallel so as to create a desired electrical output capacity.

17. The method of claim 9, further comprising mounting the polyimide film substrate directly to a surface of a spacecraft or an airplane.

18. The method of claim 9, further comprising mounting the flexible photovoltaic array to a surface of a spacecraft or an airplane.

* * * * *